US007169286B2

(12) United States Patent
Qiao (10) Patent No.: US 7,169,286 B2
(45) Date of Patent: Jan. 30, 2007

(54) PROCESS CONTROL METHODS OF ELECTROPOLISHING FOR METAL SUBSTRATE PREPARATION IN PRODUCING YBCO COATED CONDUCTORS

(75) Inventor: Yunfei Qiao, Schenectady, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 10/881,821

(22) Filed: Jun. 28, 2004

(65) Prior Publication Data

US 2005/0000826 A1 Jan. 6, 2005

Related U.S. Application Data

(60) Provisional application No. 60/483,956, filed on Jul. 1, 2003.

(51) Int. Cl.
*C25F 3/16* (2006.01)
(52) U.S. Cl. .................................. 205/661; 205/672
(58) Field of Classification Search ................ 205/660, 205/205, 661, 672; 204/129.75
See application file for complete search history.

(56) References Cited

U.S. PATENT DOCUMENTS

| | | | | |
|---|---|---|---|---|
| 3,803,014 A | * | 4/1974 | Atkinson | 204/206 |
| 3,900,376 A | * | 8/1975 | Copsey et al. | 205/712 |
| 4,247,377 A | * | 1/1981 | Eckler et al. | 205/658 |
| 4,563,257 A | * | 1/1986 | Sova | 205/661 |
| 5,496,585 A | * | 3/1996 | Hamilton et al. | 427/239 |
| 5,660,708 A | * | 8/1997 | Tezuka et al. | 205/205 |
| 6,017,437 A | | 1/2000 | Ting et al. | |
| 6,365,025 B1 | | 4/2002 | Ting et al. | |
| 6,440,295 B1 | | 8/2002 | Wang | |
| 6,495,007 B2 | | 12/2002 | Wang | |
| 6,544,402 B2 | | 4/2003 | Graf | |
| 6,893,505 B2 | * | 5/2005 | Peace | 118/506 |
| 2005/0000826 A1 | * | 1/2005 | Qiao | 205/660 |

OTHER PUBLICATIONS

Kramer, D. A. "Magnesium and Magnesium Alloys" Kirk-Othmer Encyclopedia of Chemical Technology John Wiley & Sons, Inc., 2001, section 4.1.5, paragraph 1, lines 12-14. Accessed online DOI: 10.1002/0471238961.1301071423091219.a01.pub2.*
Qiao et al., An overview of the coated conductor progress at IGC-SuperPower, 2002, Physica C, 382, 48-51.*
Qiao et al, Fabrication of 100 A class, 1 m long coated conductor tapes by metal organic chemical vapor deposition and pulsed laser deposition, 2003, Physica C, 392-296, 859-862.*
Qiao et al, Progress in scale-up of second generation high-temperature superconductors at SuperPower Inc, Physica C, 426-431, 849-857.*
Qiao et al., Scale Up of High-Performance Y-Ba-Cu-O Coated Conductors, IEEE Transactions on Applied Superconductivity, 2003, vol. 13, No. 2, 2492-2495.*
R. Nemetschek, et al., "Continuous Coated Conductor Fabrication by Evaporation", Presented at EUCAS 2003, Sep. 14-18, 2003, Sorrento, Italy, 5 pgs.

* cited by examiner

*Primary Examiner*—Roy King
*Assistant Examiner*—Michael P. Alexander
(74) *Attorney, Agent, or Firm*—Larson Newman Abel Polansky & White, LLP (57) ABSTRACT

Disclosed is a reel-to-reel substrate tape polishing and cleaning system including precleaning, electropolishing section and post cleaning sections and which is suitable for polishing and cleaning long lengths of metal substrate tape used in the manufacture of HTS-coated tape.

13 Claims, 10 Drawing Sheets

PROCESS CONTROL METHODS OF ELECTROPOLISHING FOR METAL SUBSTRATE PREPARATION IN PRODUCING YBCO COATED CONDUCTORS

This application claims priority from U.S. Provisional Application Ser. No. 60/483,956 filed Jul. 1, 2003.

BACKGROUND

Metal substrate preparation is a critical process step in the production of commercially suitable YBCO coated conductors. The surface smoothness, uniformity and cleanliness of the metal substrate has a large influence on the texture of the buffer and the current carrying capability of the YBCO superconducting layer deposited on the buffered metal substrate.

Metal substrates up to 100 meters long can be prepared routinely by mechanical/chemical mechanical polishing. Although high current has been achieved in such lengths of mechanically polished YBCO coated conductors, it is difficult to produce conductors with such performance characteristics over long lengths due to defects and deformation generated by contact and the low speed of mechanical polishing.

As stated in Kreiskott, Sascha et al., Continuous electropolishing of Hastelloy substrates for ion-beam assisted deposition of MgO, Supercond. Sci. Technol. 16 (2003) 613–616, commercial applications of high temperature superconducting wires require fast and cost effective production processes. Electropolishing as an alternative approach of substrate preparation has a speed of at least an order of magnitude higher than mechanical polishing. Surface smoothness comparable to mechanical polishing has been achieved in prototype reel-to-reel electro polishing. This invention addresses methods for process control in electro polishing to produce suitable substrates for commercial YBCO coated conductor production.

Theoretically, the uniformity of electropolishing is much better than that of mechanical polishing. Electropolishing can polish metal substrates at speeds in the range of tens of meters per hour. Multiple tapes can be run in parallel or wide tapes may be utilized. Conventional electropolishing processes utilize external mechanical contacts which impose a limit on the scalability of the process. Nonetheless electropolishing appears to be the preparation technique of the future. However, metal tapes thus polished still have microscopic defects that affect the performance of YBCO coated conductors.

Two major defects are observed. The first is the presence of residual particles on the surface of the polished substrate due to residual lubricant on the tape and contamination in the electropolishing process solution and rinsing solutions. The second is the presence of a columnar structure across the tape width due to the vertically circulating whirl flow of the electropolishing solution.

It is important to develop new methods that utilize a modified electropolishing process in order to achieve residue free tapes and to minimize the existence of a columnar structure across the width of the tape.

It is an object of this invention to reduce the defects present on metal substrates to be used to produce superconducting tapes.

It is another object of this invention to greatly increase the performance of YBCO coated conductors.

It is an object of the invention to provide a system and method for surface preparation of long lengths of metal substrates in a continuous manner.

It is another object of the invention to provide a cleaning process for producing a highly clean substrate surface that can, after a subsequent film deposition process, achieve high current densities in long lengths of HTS-coated tape.

It is yet another object of the invention to provide a polishing process for producing a substrate having a smooth surface that is of very high quality in a single polishing pass.

It is yet another object of the invention to provide a substrate for high current density superconducting tapes.

SUMMARY

These objects and other benefits are obtained by the inventive method of utilizing flow control for water, air and acids in each process cell/bath. Each cell/bath has its own dedicated reservoir with its own filter, pump, bypass valve, pressure gauge, flow indicator and regulator to control process parameters and residual particles.

Surfactant is utilized in the ultrasonic cleaning step to eliminate oil residue before electropolishing.

Submerged multiple electrodes/electrode pairs are utilized to maximize solution life and to obtain better surface finish.

Fluid circulation is configured by manifolds in the electropolishing cell to direct the electropolishing solution flow along tape length direction instead of across tape width.

Prior to electropolishing, an in-line electrocleaning (pickling) process is provided to descale the substrate, removing oxide particle or oxide layer and exposing a fresh surface in preparation for electropolishing.

To minimize the environmental impact of the process and to increase productivity, in-line deionized water regeneration is provided to collect waste water from each rinse tank and transfer it to a reservoir. The waste water is treated to convert the water to qualified deionized water thereby reducing consumption of deionized water, minimizing down time and permiting maximum water usage in the process while minimizing overall usage for environmental reasons.

A counter flow mechanism is provided to feed fresh deionized water at the last rinse station. The over flow of rinse water from this station is introduced into the other rinse stations in a direction counter to tape movement and is allowed to overflow or is pumped to a reservoir where it is held for deionized water regeneration.

DETAILED DESCRIPTION OF THE INVENTION

The present invention is a reel-to-reel substrate tape polishing and cleaning system suitable for polishing and cleaning long lengths of metal substrate tape used in the manufacture of HTS-coated tape. The polishing and cleaning system of the present invention includes precleaning, electropolishing and post cleaning sections. The electropolishing section further includes contact flood rinsing stations and multiple polishing stations in combination with multiple bipolar/DC contacts and a subsequent drag out rinsing station, each with an individual liquid supply reservoir, filters and flow control devices arranged along the axis of the translating metal substrate tape.

The inventive methods disclosed include a new configuration of the process steps, sequencing the cleaning and polishing of the substrate in a manner such that the final product contains a greatly diminished level of defects.

The new configuration includes precleaning, electropolishing and post cleaning sections. The precleaning section includes water rinsing, ultrasonic cleaning and acid rinsing.

In one preferred embodiment, the precleaning section includes water rinsing, ultrasonic cleaning preferably utilizing non-foaming surfactant and electrocleaning with bipolar electrodes in light acid. Electrocleaning with bipolar electrodes is accomplished by translating the submerged substrate tape which is not connected to the power supply, between an anode and a cathode. At least one pair of anode and cathode is used for electrocleaning. The configuration of the bipolar anode/cathode pair can be arranged in any polarity order or by adding extra anode/cathode[s] in additional to the bipolar pairs. These anodes and cathodes are connected to the power supply and are placed in the longitudinal direction of the to-be-polished substrate metal tape. At low current, the surface of the substrate closest to the anode becomes cathodic and the surface of the substrate nearest the cathode becomes anodic. The anodic surface is scrubbed by evolving hydrogen while the cathodic surface is scrubbed by oxygen evolution. As the substrate passes through the series of cells of reversed polarity, the alternative hydrogen and oxygen scrubbing removes irregularities in the surface and results in a surface, after rinsing, ready for electropolishing.

The electropolishing section includes at least one cell with at least one multiple bipolar/DC contact disposed in juxtaposition to each cell so as to reduce the current resistance and to limit the heating of the metal tape.

The bipolar/DC contacts are submerged in the solutions. In the bipolar configuration, pairs of anodes and cathodes are disposed next to each other along the length of to be polished metal tape. There is no physical contact between the anodes/cathodes and the to be polished metal tape; electric current is passed from the anodes to the metal tape through the electropolishing solution.

In one embodiment of the invention contact flood rinsing stations are interposed between each of multiple electropolishing stations. The contact flood rinse stations contain anode or anode pairs that contact with the to-be-polished metal tape. The metal tape is polished as it moves through electropolishing station bath/cell[s] that contain cathodes connected to the negative terminal of the power supply. The contact flood rinsing also removes any nonadherent deposits of debris removed during the electropolishing step.

In a second embodiment utilizing bipolar electrodes, the electropolishing assembly includes multiple electrolytic cells with adjacent cells containing electrodes of reversed polarity.

In one embodiment a cathode is used in the last step of the electropolishing process. The benefit derived from this variation is better efficiency of polishing (no current leaking), better cleanliness of tape (diminishment of the amount of residue resulting from the products of the high temperature reaction between the metal and the electropolishing solution) and longer solution life.

The electrodes utilized in the electropolishing cells may vary in length (the dimension parallel to the longitudinal direction of to-be-polished substrate tape) from about 0.5 inch to about 4 inches, preferably from about 0.5 to about 2 and most preferably from about 0.75 to about 1.5 inches.

In a preferred configuration of the invention, the electrodes are no longer than 4 inches or are partially shielded to obtain optimum surface smoothness. In general, the shield may cover from about 1 to about 99 percent of the electrode. The shield is utilized most desirably where the electrodes are longer than 4 inches and is utilized to achieve the same smoothness with such long electrodes as is achieved with 4 inch or shorter electrodes.

The post cleaning section includes drag out rinsing, light acid rinsing and final DI rinsing.

In the process, the substrate is first subjected to cleaning in precleaning assembly 120 or 125. It then moves through the electropolishing assembly 140 or 150, and the post cleaning DI rinse assembly 160.

By translating through the precleaning stations 122a, 122b, 124 and 126 and multiple polishing stations 152a, 152b, 152c, 154a, 154b in a first embodiment or precleaning stations 122a, 122b, 124 and 128 and multiple polishing stations 146a, 146b, 146c, 146d, 148a, 148b, 148c, and 148d in a second embodiment, in combination with the subsequent cleaning stations 162a, 162b, and 164, the metal substrate tape 116 experiences a series of cleaning, polishing and cleaning events to progressively diminish its surface contamination and roughness. More specifically, the metal substrate tape 116 experiences, via progressive stages, first a water rinsing, surfactant bath and acid dip, then electropolishing, then a drag out rinsing and acid dip event in combination with a respective rinsing event as it translates through the polishing section.

The pre and post cleaning assemblies 125 and 160 may include an ultrasonic cleaning station 124 and at least one rinsing bath 122a, preferably two rinsing baths 122a and 122b, with individual liquid supply reservoirs, filters 106 and flow control devices 108. The cleaning and rinsing baths act to control particle contamination and remove any surface contaminants that are detrimental to the surface quality of the substrate tape and which may limit the achievable current density in the finished HTS-coated tape. Thus, the metal substrate tape 116 achieves, in a single pass through the polishing and cleaning system of the present invention, a surface smoothness and cleanliness that is suitable for the subsequent deposition of a buffer layer.

Figure 1A:
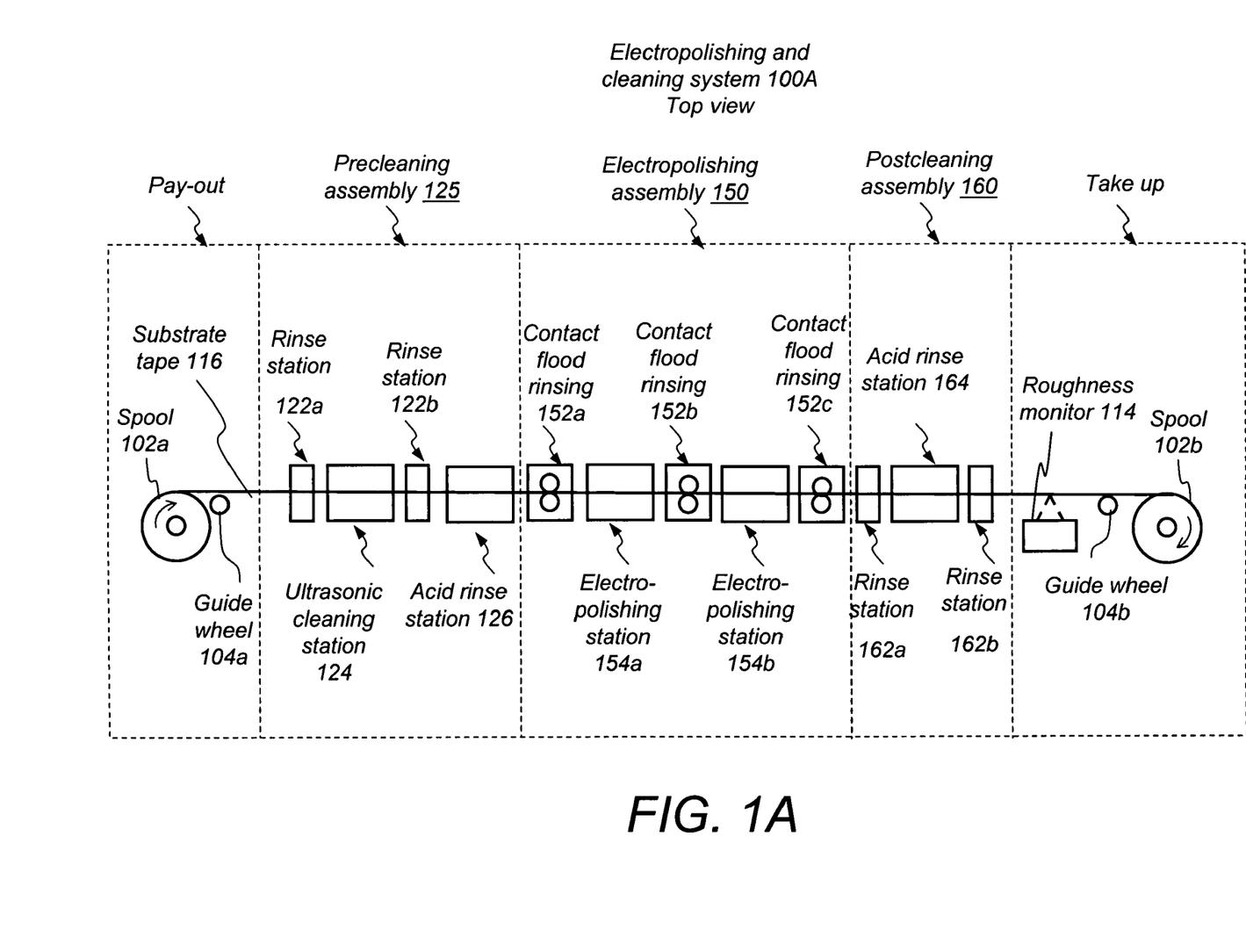
FIG. 1A illustrates a top view of a first embodiment of an electropolishing and cleaning system of the present invention suitable for polishing long lengths of metal substrate tape used in the manufacture of HTS-coated tape.
Figure 1B:
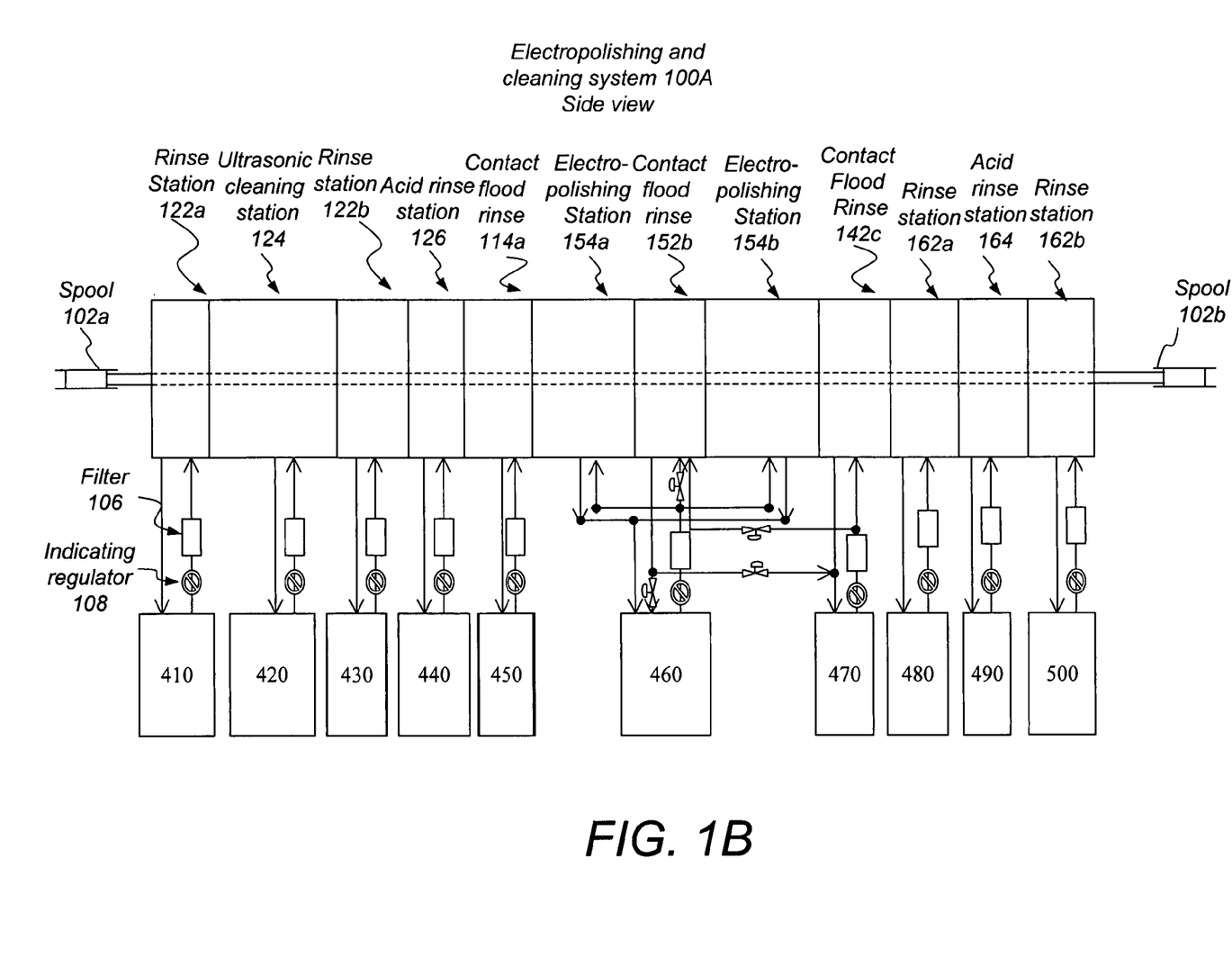
FIG. 1B illustrates a side view of a first embodiment of an electropolishing and cleaning system with individual reservoirs, particle control, flow control and regulating devices of the present invention suitable for polishing long lengths of metal substrate tape used in the manufacture of HTS-coated tape.

FIGS. 1A and 1B illustrate a polishing and cleaning system 100A for the surface preparation of a substrate tape used in the manufacture of HTS-coated tape in accordance with the invention. As illustrated in FIG. 1A, the polishing and cleaning system 100A includes a precleaning section 125 that performs the substrate tape cleaning function and feeds a polishing section 150 that performs the substrate tape polishing function and which feeds a post cleaning section 160 that performs a subsequent substrate tape cleaning function.

The polishing and cleaning system 100A includes at least one pair of spools 102, i.e., a spool 102a and a spool 102b (FIG. 1A). The spool 102a serves as a payout spool located at the entry point of the polishing and cleaning system 100. A length of substrate tape 116 that is formed of a metal such as stainless steel or a nickel alloy such as Inconel/Hastelloy is wound upon the spool 102a. The substrate tape 116 may pay out from the top of the spool 102a as shown in FIG. 1A or, alternatively, from the underside of the spool 102a. The substrate tape 116 is capable of withstanding high temperatures and vacuum conditions, and is typically between 3 mm and 15 cm in width and may be upwards of several kilometers in length. The substrate tape 116 typically has several meters of "leader" at both ends to aid in handling. The substrate tape 116 is laced from the spool 102a through the precleaning section 125, the polishing section 150 and the post cleaning section 160 of the polishing and cleaning system 100A and wound onto the spool 102b, which serves as a take-up spool, at the exit point of the polishing and cleaning system 100A.

With reference to the portion of FIG. 1A and FIG. 1B which illustrates the tape precleaning function, the precleaning section 125 further includes at least one rinse, ultrasonic and/or solution rinse/bath and acid rinse station(s). Each rinse/bath station has a separate process cell located along the path of substrate tape 116. Each rinse/bath station has a separate solution container or reservoir located at the lower part of the section. The solution of each rinse/bath station is pumped to the process cell through a particulate control device, a filter 106 for example, and a flow control device, for example a flow meter/regulator 108.

Upon exit from the precleaning section the substrate enters the electropolishing section. The electropolishing section incorporates multiple cells with additional DC contacts among each cell. In the conventional electropolishing procedure, single cells are used and each cell contains two DC contacts. The provision of multiple cells, preferably two or more cells with each cell containing a minimum of one DC contacts provides the following benefits: evenly distributed current along the tape and a lesser amount of heat generated due to the resistance of the metal tape. These benefits and the superior results obtained are caused by diminishment of the amount of residue resulting from the products of the high temperature reaction between the metal and the electropolishing solution.

With reference to the portion of FIG. 1A and FIG. 1B, which illustrates the substrate tape polishing function, the polishing section 150 further includes at least two contact rinse/, electropolishing station(s). Each rinse station has a separate process cell located along the path of substrate tape 116. A current is applied to the substrate tape through DC contacts in contact rinse stations while it passes through the polishing stations to activate the polishing process. Each rinse/bath station has a separate solution container or reservoir located at the lower part of the section. The solution of each rinse/bath station is pumped to the process cell through a particulate control device, a filter for example, and a flow control device, for example a flow meter/regulator.

With reference to the portion of FIG. 1A and FIG. 1B, which illustrates the substrate tape post cleaning function, the post cleaning section 160 further includes at least one rinse, ultrasonic and/or solution rinse/bath station(s). Each rinse/bath station has a separate process cell located along the path of substrate tape 116. Each rinse/bath station has a separate solution container or reservoir located at the lower part of the section. The solution of each rinse/bath station is pumped to the process cell through a particulate control device, a filter for example, and a flow control device, for example a flow meter/regulator.

Figure 1C:
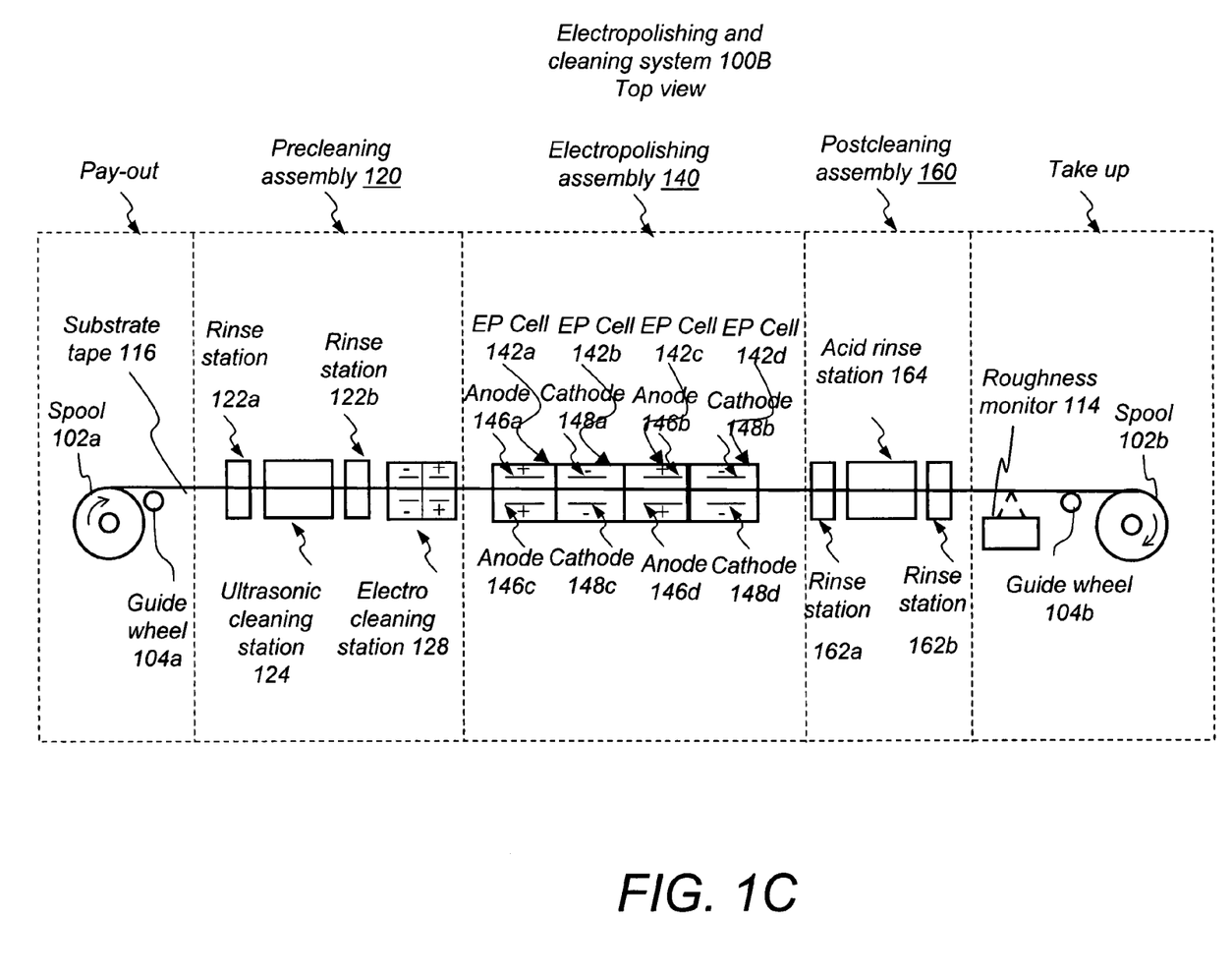
FIG. 1C illustrates a top view of an alternative embodiment of an electropolishing and cleaning system with bipolar electrocleaning and bipolar electropolishing suitable for polishing long lengths of metal substrate tape used in the manufacture of HTS-coated tape.
Figure 1D:
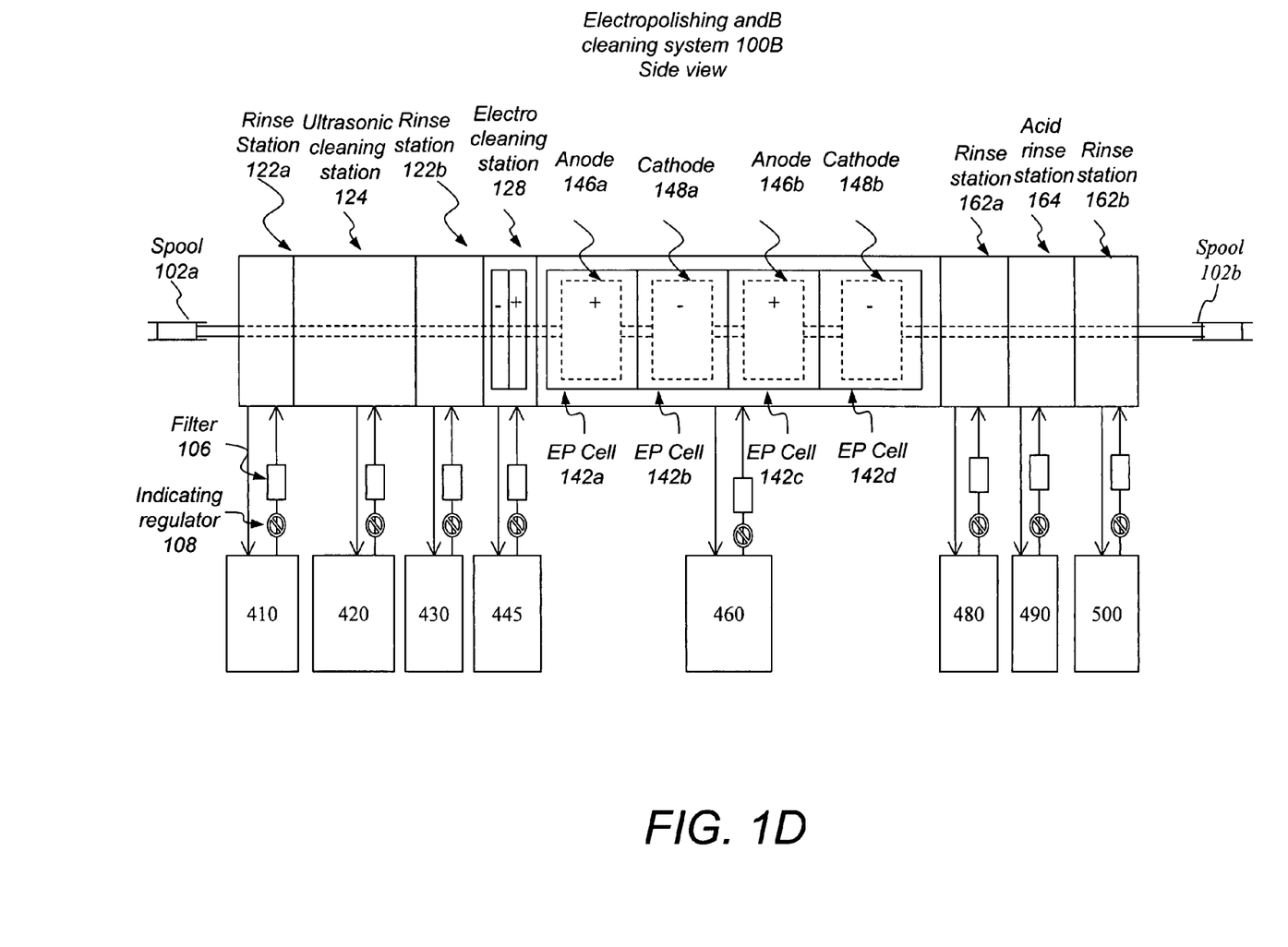
FIG. 1D illustrates a side view of an alternative embodiment of an electropolishing and cleaning system with bipolar electrocleaning and bipolar electropolishing with individual reservoirs, particle control, flow control and regulating devices suitable for polishing long lengths of metal substrate tape used in the manufacture of HTS-coated tape.

FIGS. 1C and 1D illustrate a polishing and cleaning system 100B for the surface preparation of a substrate tape used in the manufacture of HTS-coated tape in accordance with the invention. As illustrated in FIG. 1C, the polishing and cleaning system 100B includes a precleaning section 120 that performs the substrate tape cleaning function and feeds a polishing section 140 that performs the substrate tape polishing function and which feeds a post cleaning section 160 that performs a subsequent substrate tape cleaning function.

With reference to FIGS. 1C and 1D, the polishing and cleaning system 100B includes at least one pair of spools 102, i.e., a spool 102a and a spool 102b (FIG. 1C). The spool 102a serves as a payout spool located at the entry point of the polishing and cleaning system 100B. A length of substrate tape 116 that is formed of a metal such as stainless steel or a nickel alloy such as Inconel/Hastelloy is wound upon the spool 102a. The substrate tape 116 may pay out from the top of the spool 102a as shown in FIG. 1C or, alternatively, from the underside of the spool 102a. The substrate tape 116 is capable of withstanding high temperatures and vacuum conditions, and is typically between 3 mm and 15 cm in width and may be upwards of several kilometers in length. The substrate tape 116 typically has several meters of "leader" at both ends to aid in handling. The substrate tape 116 is laced from the spool 102a through the precleaning section 120, the polishing section 140 and the post cleaning section 160 of the polishing and cleaning system 100B and wound onto the spool 102b, which serves as a take-up spool, at the exit point of the polishing and cleaning system 100B.

With reference to the portion of FIGS. 1C and 1D which illustrates the tape precleaning function, the precleaning section 120 further includes at least one rinse, ultrasonic and/or solution rinse/bath and electrocleaning in solution station(s) 128. Each rinse/bath station has a separate process cell located along the path of substrate tape 116. Each rinse/bath station has a separate solution container or reservoir located at the lower part of the section. The solution of each rinse/bath station is pumped to the process cell through a particulate control device, a filter 106 for example, and a flow control device, for example a flow meter/regulator 108.

Upon exit from the precleaning section the substrate enters the electropolishing section. The electropolishing section incorporates multiple cells with additional bipolar contacts in each cell. In the conventional electropolishing procedure, single cells are used and each cell contains two bipolar electrodes. The provision of multiple cells, preferably two or more cells with each cell containing a minimum of one pair of bipolar electrodes provides the following benefits: evenly distributed current along the tape and a lesser amount of heat generated due to the resistance of the metal tape. These benefits and the superior results obtained are caused by diminishment of the amount of residue resulting from the products of the high temperature reaction between the metal and the electropolishing solution.

With reference to the portion of FIG. 1C and FIG. 1D that illustrate the substrate tape polishing function, the polishing section 140 includes at least two electropolishing station(s) containing bipolar electrodes. In the embodiment of the figures four electropolishing cells, 142a, 142b, 142c, and 142d are shown with alternating polarities.

With reference to the portion of FIG. 1C and FIG. 1D, which illustrates the substrate tape post cleaning function, the post cleaning section 160 further includes at least one rinse, ultrasonic and/or solution rinse/bath station(s). Each rinse/bath station has a separate process cell located along the path of substrate tape 116. Each rinse/bath station has a separate solution container or reservoir located at the lower part of the section. The solution of each rinse/bath station is pumped to the process cell through a particulate control device, a filter for example, and a flow control device, for example a flow meter/regulator.

Upon exit from the polishing section the substrate enters the post cleaning section. The post cleaning section includes drag out rinsing, light acid rinsing and final DI rinsing. In the drag out rinsing step reaction products and the electropolishing solution are removed. Light acid rinsing is accomplished utilizing an acid mixture of sulfuric acid and water and is preferably conducted at a temperature in the range of from about 15 C. to about 29 C. The acid concentration is in the range of 0.5 to about 20%. Final DI rinsing occurs at room temperature.

Each process step is separated from the other steps by conventional means, such as shields, partitions and air blanket to prevent water or acid drag out. All utilities are metered in the conventional manner by flow meters and pressure regulating valves as required.

Figure 2A:
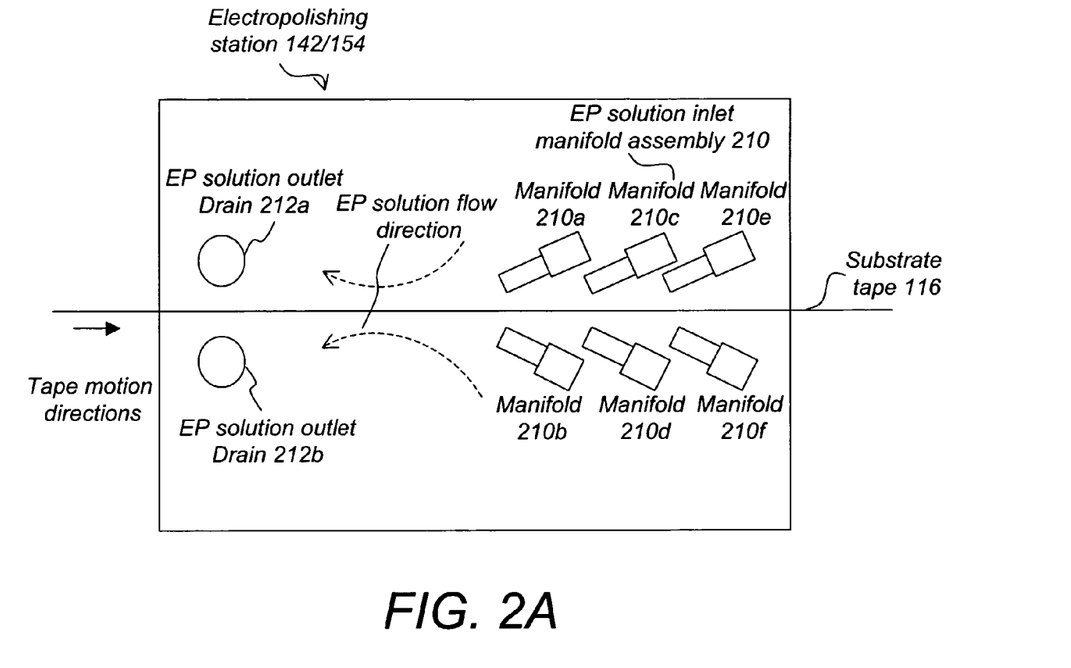
FIGS. 2A, 2B and 2C illustrate a top view, side view and an end view, respectively, of an electropolishing station bath/cell suitable for use as a polishing station within the polishing and cleaning system of the present disclosure.
Figure 2B:
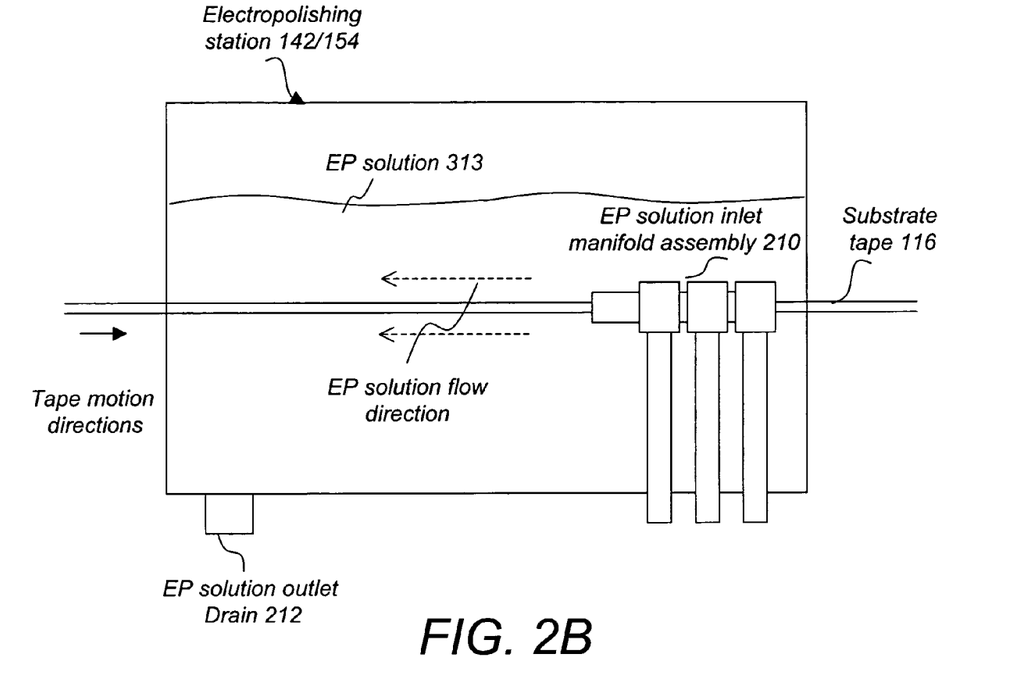
Figure 2C:
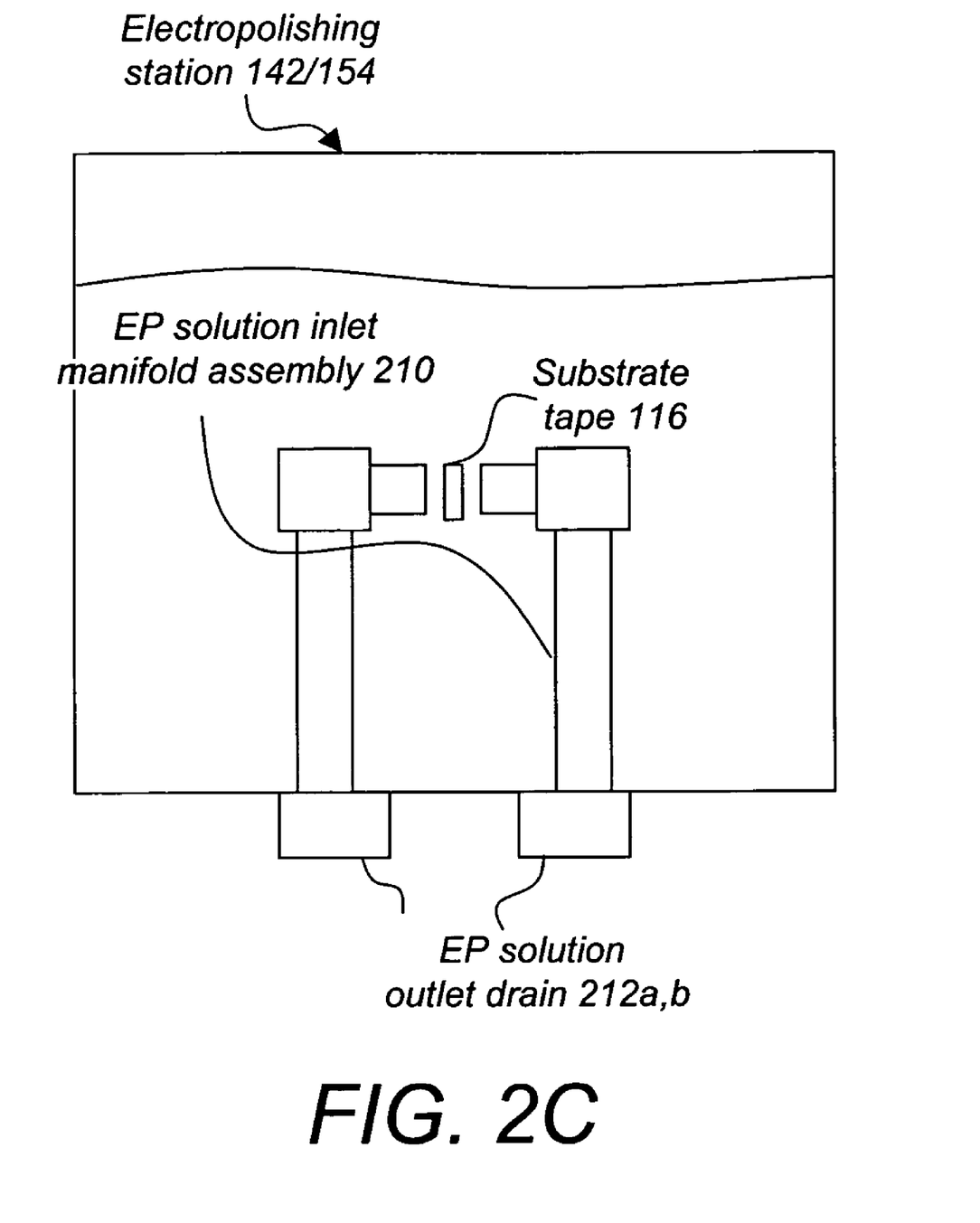

FIGS. 2A, 2B and 2C respectively show top side and end views of one embodiment of an electropolishing section, 142/154, of the process. The substrate tape 116 enters the electropolishing station and is contacted by flowing electropolishing solution injected into the electropolishing section EP cell 154a and 154b in a first embodiment or 142a, 142b, 142c, or 142d in a second embodiment through the electropolishing solution inlet manifold assembly 210 comprising multiple inlet manifolds 210a, 210b, 210c, 210d, 210e and 210f which inject EP solution 313 constantly to maintain tape 116 submerged in EP solution 313. In a preferred embodiment, the inlet manifold assembly 210 comprises 6 inlet manifolds, three located so as to impinge on opposite sides of the translating substrate tape 116. The electropolishing solution flows over the tape and is recirculated through electropolishing solution drain outlets 212a and 212b. The tape exits the first EP cell and moves on to the next EP cell in the electropolishing section until it has passed through all the cells present and then moves to the next section, the postcleaning section 160.

Figure 3A:
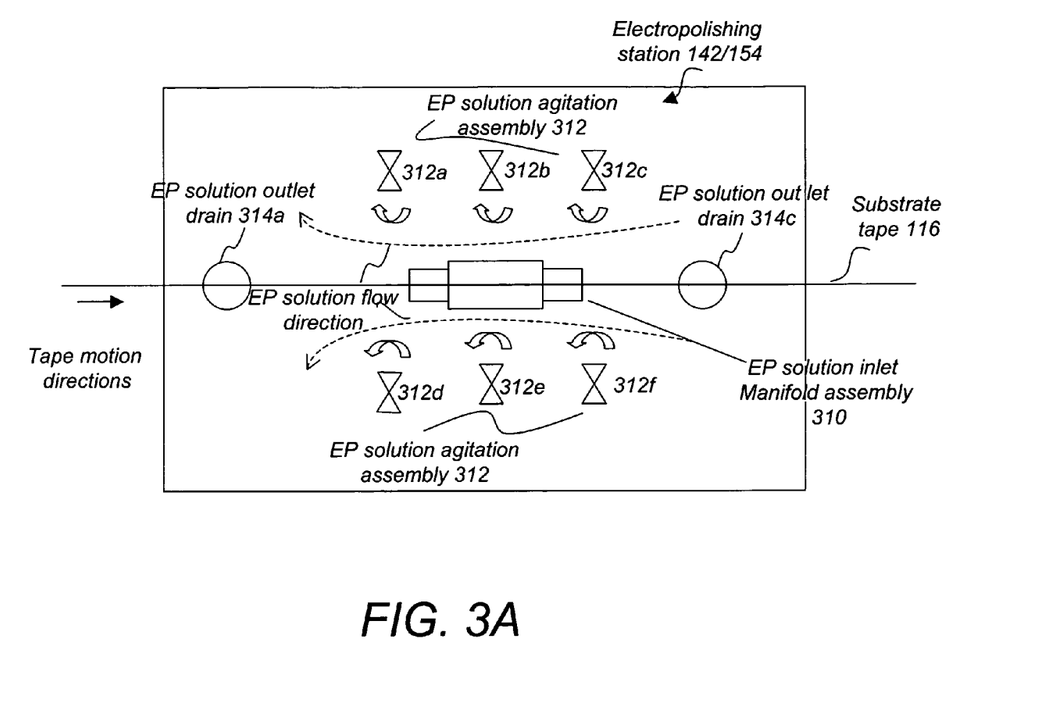
FIGS. 3A, 3B, and 3C illustrate a top view, side view and an end view, respectively, of an alternative embodiment of an electropolishing station bath/cell suitable for use as a polishing station within the polishing and cleaning system of the present disclosure.
Figure 3B:
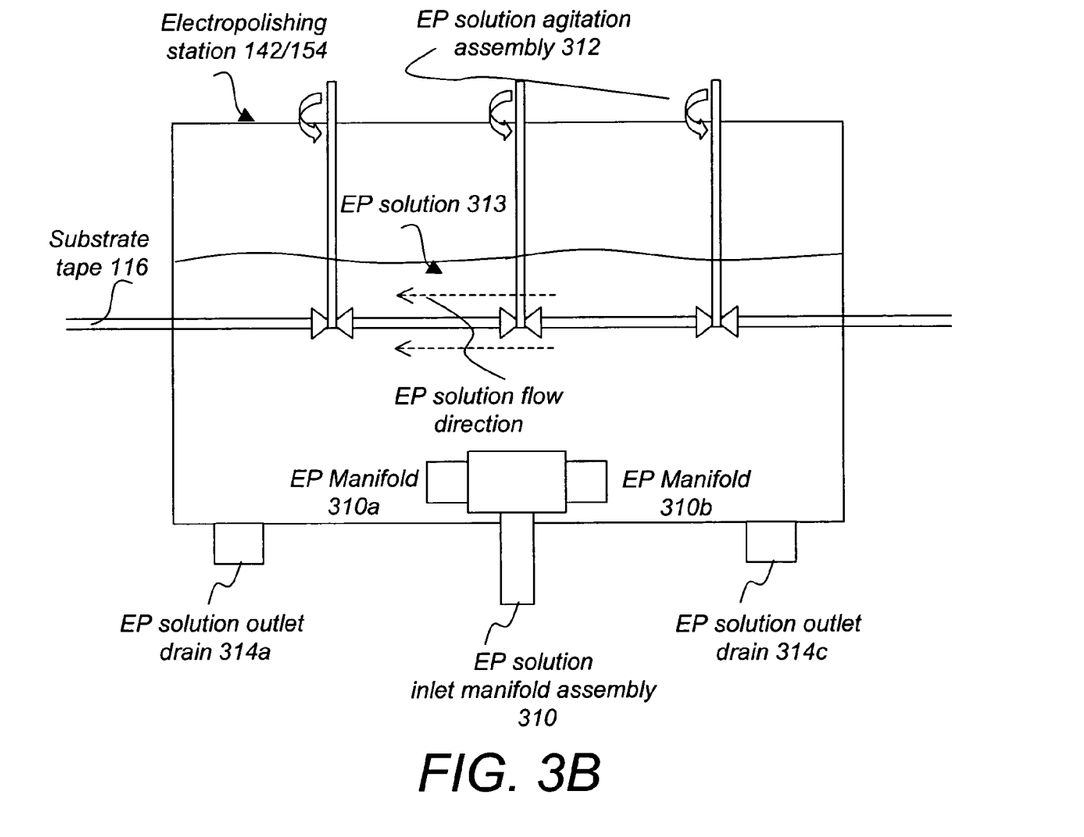
Figure 3C:
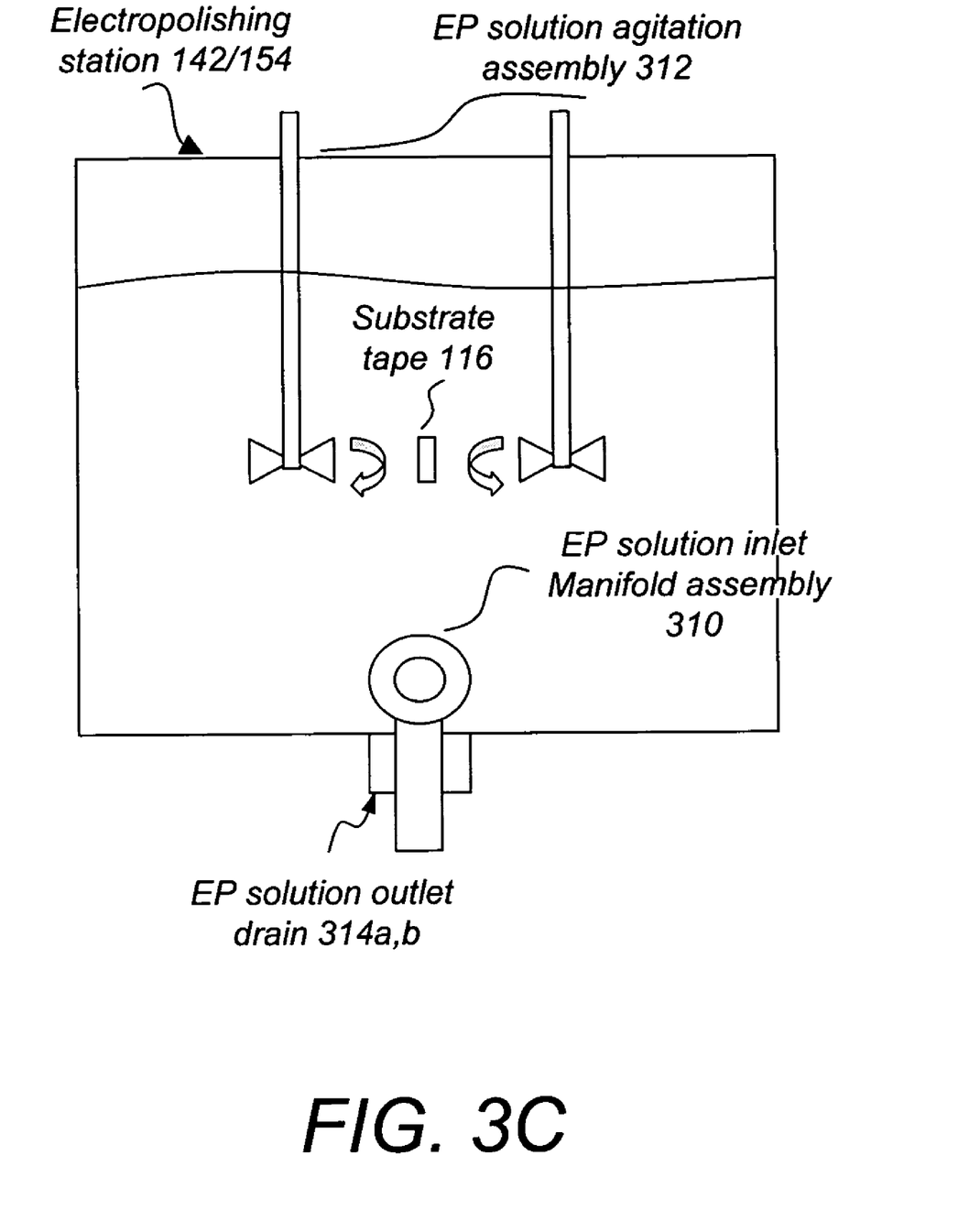

FIGS. 3A, 3B and 3C respectively show top side and end views of an alternate embodiment of the electropolishing section, 142/154, of the process. The substrate tape 116 enters the electropolishing station and is contacted by flowing electropolishing solution injected into the electropolishing section tank—through the electropolishing solution inlet manifold assembly 310 comprising multiple inlet manifolds 310a and 310b which inject EP solution 313 constantly to maintain tape 116 to be submerged by EP solution. In a preferred embodiment the inlet manifold assembly 310 comprises 2 inlet manifolds, one located at approximately the longitudinal midpoint of the electropolishing tank 142/154 with one manifold injecting solution 313 toward the entering tape 116 and the other positioned to inject electropolishing solution toward the leaving tape. An electropolishing solution agitation assembly 312 comprising a multitude of low shear mixers 312a, 312b, 312c, 312d, 312e, 312f are positioned on either side of the translating tape and serve to bring fresh electropolishing solution into contact with the tape as it moves through the electroplating station. The electropolishing solution flows over the tape and is recirculated through electropolishing solution drain outlets 314a and 314b. The tape exits the electropolishing section and moves to the next section, the postcleaning section.

The invention claimed is:

1. A method for preparing a metal substrate tape, comprising:
   translating the metal substrate tape from a payout spool and into an precleaning section housing a precleaning solution;
   precleaning the metal tape substrate by translating the metal tape substrate through the precleanmg solution;
   electropolishing the metal tape substrate by translating the metal tape substrate from the precleaning section and through an electropolishing section, the electropolishing section having an electropolishing solution and electropolishing cells by which the metal tape substrate passes, the electropolishing cells each having at least one electrode and adjacent electropolishing cells having alternating polarity such that each electropolishing cell has an alternating polarity with respect to its adjacent cells, the last electropolishing cell comprising a cathode; and
   winding the metal tape substrate onto a take-up spool.

2. The method of claim 1 further comprising applying a current to said substrate.

3. The method of claim 1 wherein the current density in the precleaning section is in to range of 20 to 300 A/ft$^2$, and the current density in the electropolishing section is in the range of 200 to 1200 A/ft$^2$.

4. The method of claim 1, wherein adjacent electropolishing cells form anode/cathode pairs, each anode/cathode pair being arranged on the same side of the substrate.

5. The method of claim 4, wherein each electropolishing cell contains first and second electrodes of the same polarity, the first and second electrodes being arranged on opposite sides of the substrate.

6. The method of claim 1, wherein the electropolishing solution is in fluid communication with a particle control mechanism.

7. The method of claim 1, wherein the electropolishing solution is flowed through the electropolishing section along a length of the substrate rather than a width of the substrate.

8. The method of claim 7, wherein the electropolishing solution is flowed along a direction opposite the direction along which the substrate is translated through the electropolishing section.

9. The method of claim 1, wherein precleaning includes electrocleaning the metal tape substrate, in which species evolving from the precleaning solution scrub the metal tape substrate.

10. The method of claim 9, wherein the species evolving include at least one of oxygen and hydrogen.

11. The method of claim 1, wherein the precleaning solution includes a surfactant.

12. The method of claim 1, further comprising post cleaning the metal tape substrate after electropolishing, by translating the metal tape substrate into a post cleaning section having a post cleaning solution.

13. A method for preparing a metal substrate tape, comprising:

translating the metal substrate tape from a payout spool and into an precleaning section housing a precleaning solution, the precleaning solution containing a surfactant and being in fluid communication with a first particle control mechanism;

precleaning the metal tape substrate by translating the metal tape substrate through the precleaning solution;

electropolishing the metal tape substrate by translating the metal tape substrate from the precleaning section and through an electropolishing section, the electropolishing section having an electropolishing solution and electropolishing cells by which the metal tape substrate passes, the electropolishing cells each having at least one electrode and adjacent electropolishing cells having alternating polarity such that each electropolishing cell has an alternating polarity with respect to its adjacent cells the last electropolishing cell comprising a cathode, the electropolishing solution being in fluid communication with a second particle control mechanism, wherein the electropolishing solution is directed to flow along a length of the substrate rather than across a width of the substrate;

post cleaning the metal tape substrate by translating the metal tape substrate through a post cleaning solution; and winding the metal tape substrate onto a take-up spool.

* * * * *